US010602598B2

(12) United States Patent
Wang

(10) Patent No.: US 10,602,598 B2
(45) Date of Patent: Mar. 24, 2020

(54) DIMMING CIRCUIT FOR LED LAMP

(71) Applicants: Self Electronics Co., Ltd., Ningbo, Zhejiang (CN); Wanjiong Lin, Ningbo, Zhejiang (CN); Self electronics USA Corporation, Norcross, GA (US)

(72) Inventor: Ke Wang, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 0 days.

(21) Appl. No.: 16/438,234

(22) Filed: Jun. 11, 2019

(65) Prior Publication Data

US 2020/0015328 A1    Jan. 9, 2020

(30) Foreign Application Priority Data

Jul. 9, 2018  (CN) ........................... 2018 1 0745873

(51) Int. Cl.
*H05B 33/08* (2020.01)
*H05B 45/50* (2020.01)
*H03K 7/08* (2006.01)

(52) U.S. Cl.
CPC .............. *H05B 45/50* (2020.01); *H03K 7/08* (2013.01); *H05B 33/0887* (2013.01)

(58) Field of Classification Search
CPC ............ H05B 33/0809; H05B 33/0815; H05B 33/0845; H05B 33/0851
USPC .................................. 315/186, 193, 297, 307
See application file for complete search history.

(56) References Cited

U.S. PATENT DOCUMENTS

| 2009/0295776 | A1* | 12/2009 | Yu ....................... H05B 33/0818 345/212 |
| 2011/0266969 | A1* | 11/2011 | Ludorf ................ H02M 1/4258 315/294 |
| 2012/0200229 | A1* | 8/2012 | Kunst ................ H05B 33/0815 315/186 |
| 2014/0210377 | A1* | 7/2014 | Knoedgen ......... H02M 3/33507 315/307 |
| 2019/0261471 | A1* | 8/2019 | Wang ..................... H01F 38/14 |

* cited by examiner

*Primary Examiner* — Tung X Le
(74) *Attorney, Agent, or Firm* — Wang Law Firm, Inc.

(57) ABSTRACT

The invention relates to a dimming circuit of LED lamp, including a constant voltage source, a switching tube connected in series with the LED load at the output end of the constant voltage source, a short circuit detecting circuit electrically connected with the constant voltage source, and an signal processing circuit electrically connected with the output end of the short circuit detecting circuit, and driving circuit respectively connected to the output end of the signal processing circuit and the switching tube, wherein the signal processing circuit calculates whether the short circuit condition is determined, and the timing control detects the LED load short circuit recovery in the event of a short circuit. The driving circuit drives the switching tube to be turned on or off according to the control signal of the signal processing circuit under normal conditions to perform PWM dimming on the LED load, and in the case of a short circuit, the switching tube is turned off to achieve short circuit protection, and In the case of short circuit elimination of LED load, drive the switching tube to conduct temporarily to detect recovery. The dimming circuit of the LED lamp has a short circuit response speed and a good protection effect.

4 Claims, 1 Drawing Sheet

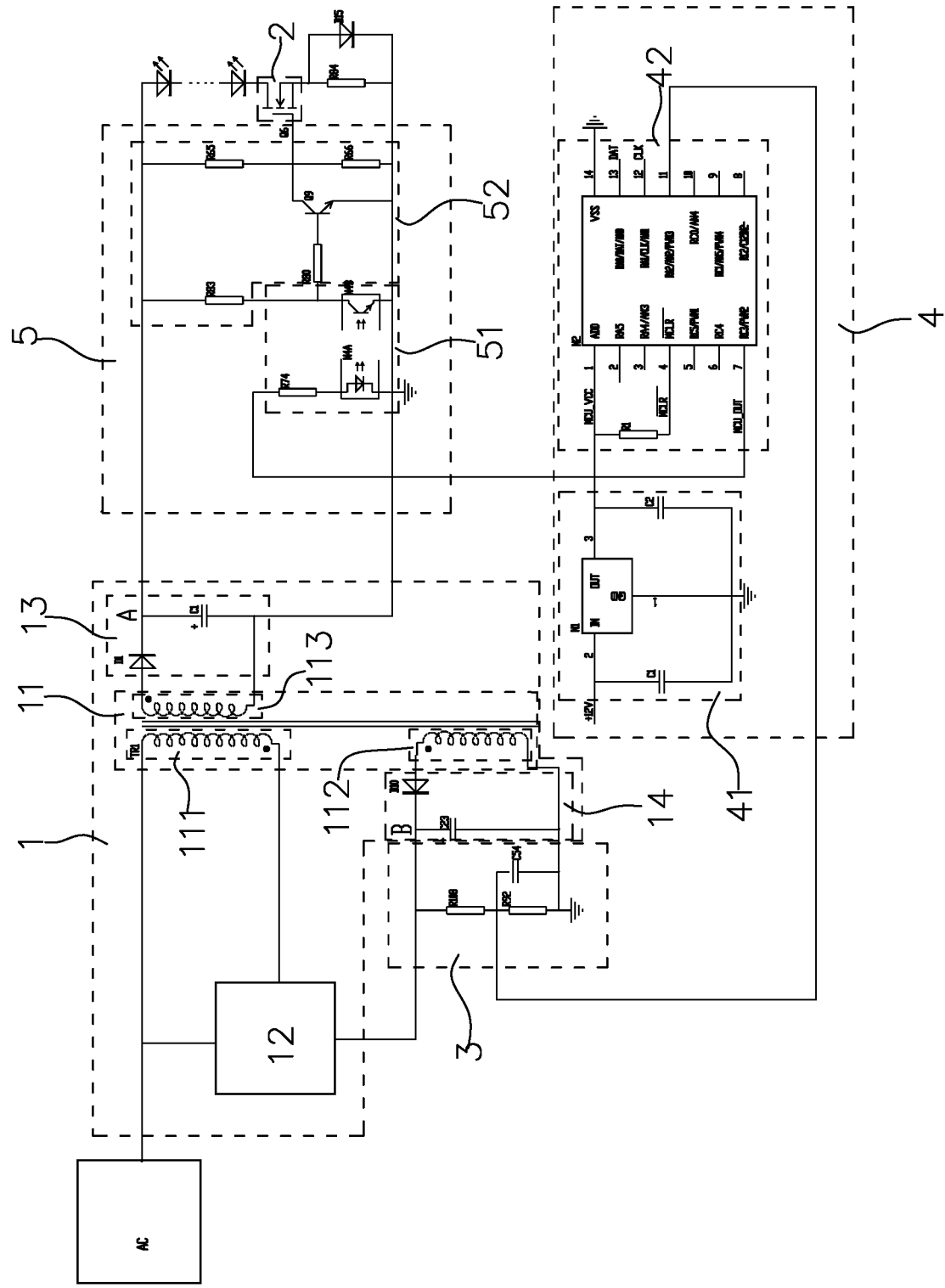

DIMMING CIRCUIT FOR LED LAMP

RELATED APPLICATION

This application claims priority to a Chinese Patent Application No. CN 201810745873.3, filed on Jul. 9, 2018.

FIELD OF THE TECHNOLOGY

The present invention relates to LED lamp control circuit technology field, with particular emphasis on a dimming circuit for LED lamp.

BACKGROUND OF THE INVENTION

As LED lighting becomes more and more intelligent the demand for lighting control and scene lighting is becoming stronger and stronger. At present, there are more and more dimming power supply products on the market. In the existing phase-cutting constant voltage dimming power supply, a switching tube is usually added to control the on/off of the output, so as to realize the change of the average value of the output current. When the output is short-circuited, the switching tube enters the variable resistance area. At this time, the switching tube is subjected to relatively large power, and as time passes, the temperature will accumulate, eventually causing the outer casing to melt and cause a fire. Therefore, the protection of the output short circuit is an important issue in the dimming power supply, directly related to the safety of its use. At present, the output short circuit or overcurrent protection adopts a self-recovery fuse or a temperature switch. The response speed in this method is relatively slow, and the LED constant voltage dimmer is often burned out, and the service life is shortened.

BRIEF SUMMARY OF THE INVENTION

Therefore, the present invention provides a dimming circuit for the LED lamp that responds to the short-circuit condition quickly, and can detect whether the short-circuit condition returns to normal, and then resumes the normal operation of the LED lamp.

The technical solution adopted by the present invention to solve the above problems is as follows: A dimming circuit of LED lamp, electrically connected to LED load, including:

constant voltage source for supplying power to the LED load;

switching tube connected in series with the LED load at the output end of the constant voltage source, and the dimming of the LED load is realized through the on and off of the switching tube;

characterized in that: the dimming circuit of LED lamp also comprising:

short circuit detecting circuit, wherein the input end of the short circuit detecting circuit is electrically connected to the constant voltage source for detecting the output voltage of the power supply circuit to obtain short circuit voltage signal;

signal processing circuit, wherein the input end of signal processing circuit is electrically connected to the output end of the short circuit detecting circuit, used for calculating whether or not a short circuit condition occurs, and is capable of timing control detecting a short circuit recovery of the LED load in the event of a short circuit;

riving circuit respectively electrically connected to the output end of the signal processing circuit and the switching tube, used for driving the switching tube to be turned on or off according to the control signal of the signal processing circuit to perform PWM dimming on the LED load under normal conditions, and driving the switching tube to be turned off for short circuit protection in the case of a short circuit, and driving the switching tube is turned off to achieve short circuit protection, and driving the switching tube to be turned on temporarily to detect the recovery condition when it is necessary to detect the elimination condition of the short circuit of the LED load.

The constant voltage source includes flyback transformer, power management chip, first rectification filter circuit, and second rectification filter circuit;

The flyback transformer including first primary coil, second primary coil, and secondary coil;

One end of the first primary coil electrically connected to external power source, and the other end of the first primary coil electrically connected to a control end of the power management chip;

Both ends of the secondary coil are electrically connected to the input end of the first rectifying and filtering circuit, and the driving circuit is connected to the output end of the first rectifying and filtering circuit, and an signal input end of the driving circuit is electrically connected to the output end of the signal processing circuit, and an drive output end of the driving circuit is electrically connected to the switching tube;

Both ends of the second primary coil are electrically connected to the input end of the second rectifying and filtering circuit;

The two power supply ends of the power management chip are respectively electrically connected to the external power source and the output end of the second rectifying and filtering circuit; the input end of the short circuit detecting circuit is connected to the output end of the second rectifying and filtering circuit.

The short circuit detecting circuit includes a first resistor R108, a second resistor (R92), and a first capacitor C54, and the first resistor R108 and the second resistor R92 are connected in series between the output ends of the second rectifying and filtering circuit, the first capacitor C54 is connected in parallel to both ends of the second resistor R92, and the output end of the short circuit detecting circuit is connected to the signal input end of the signal processing circuit at the connection point of the first resistor R108 and the second resistor R92.

The signal processing circuit includes a power supply circuit and a control chip electrically connected to the power supply circuit, an input end of the power supply circuit is electrically connected to the output end of the second rectifying and filtering circuit, and the output end of the power supply circuit is electrically connected to the power supply end of the control chip.

The driving circuit includes a signal isolation circuit and a driving control circuit, the input end of the isolation circuit is electrically connected to the control signal output end of the control chip, and the output end of the isolation circuit is electrically connected to the input end of the driving control circuit, the driving control circuit is connected to both ends of the first rectifying and filtering circuit, and the output end of the driving control circuit is electrically connected to the input end of the switching tube.

Compared with the prior art, the invention has the advantages that the dimming circuit of the LED lamp in the present invention can directly detect and acquire the voltage change when the load is short-circuited through the short circuit detecting circuit formed by the hardware, Then, through the calculation and judgment of signal processing circuit, the driving circuit is controlled to work and then turn off the switching tube and disconnect the connection of LED load, so as to realize the protection of LED load. In this process, the change value of the voltage obtained directly from the hardware circuit is used as the short-circuit signal, and the short-circuit signal can be obtained directly without additional signal processing calculation, thereby greatly improving the response speed. In addition, the signal processing circuit can also automatically timing control the driving circuit to temporarily turn on the switching tube to detect the short circuit recovery condition, and can automatically resume the normal operation of the dimming circuit of the LED lamp after the load short circuit condition is eliminated.

BRIEF DESCRIPTION OF THE DRAWINGS

The drawings described herein are intended to promote a further understanding of the present invention, as follows:

FIG. 1 is a circuit diagram of a dimming circuit of LED lamp in an embodiment of the present invention.

DETAILED DESCRIPTION OF THE INVENTION

The present application is illustrated by way of the following detailed description based on of the accompanying drawings. It should be noted that illustration to the embodiment in this application is not intended to limit the invention.

As shown in FIG. 1, a dimming circuit of LED lamp in this embodiment is electrically connected to LED load, thereby implementing dimming control of the LED load.

The dimming circuit of LED lamp includes constant voltage source 1, switching tube 2, short circuit detecting circuit 3, signal processing circuit 4, and driving circuit 5.

The constant voltage source 1 is used to supply power to the LED load. The constant voltage source 1 includes flyback transformer 11, power management chip 12, first rectifying and filtering circuit 13, and second rectifying and filtering circuit 14. The power management chip 12 performs power management work on the flyback transformer 11.

The flyback transformer 11 includes first primary coil 111, second primary coil 112, and secondary coil 113. One end of the first primary coil 111 is electrically connected to an external power source, and the other end of the first primary coil 111 is electrically connected to the control end of the power management chip 12 through a conventional mature adaptation circuit, thus enabling the power management chip 12 to perform the management of flyback transformer 11 under normal working conditions.

Both ends of the secondary coil 113 are electrically connected to the input end of the first rectifying and filtering circuit 13, the driving circuit 5 is connected to the output end of the first rectifying and filtering circuit 13, and the signal input end of the driving circuit 5 is electrically connected to the output end of the signal processing circuit 4, and the drive output end of the driving circuit 5 is electrically connected to the switching tube 2. Both ends of the second primary coil 112 are electrically connected to the input end of the second rectifying and filtering circuit 14.

Since the chip generally requires DC power supply, and the power supply voltage is low, the two power supply ends of the power management chip 12 are respectively electrically connected to the external power source and the output end of the second rectifying and filtering circuit 14 through an adaptive conversion circuit, so as to realize the power supply of power management chip 12.

The first rectifying and filtering circuit 13 and the second rectifying and filtering circuit 14 in this embodiment each include rectifier and capacitor connected in series, and the rectifiers and capacitors connected in series corresponding to the first rectifying and filtering circuit 13 and the second rectifying and filtering circuit 14 are connected between the two ends of the secondary coil 113 and the first primary coil 111 respectively, and one end of the secondary coil 113 and the first primary coil 111 connected to the capacitor is grounded. Both ends of the capacitor can be used as the output ends of the first rectifying and filtering circuit 13 and the second rectifying and filtering circuit 14. As shown in FIG. 1, the connection points of the rectifier and the capacitor in the secondary coil 113 and the first primary coil 111 are denoted as A and B, respectively.

The switching tube 2 is connected in series with the LED load at the output end of the second rectifying and filtering circuit 14, and the dimming of the LED load is realized through the on and off of the switching tube 2.

The short circuit detecting circuit 3 is for detecting the output voltage of the power supply circuit 41 to obtain a short circuit voltage signal, and the input end of the short circuit detecting circuit 3 is connected to the output end of the second rectifying and filtering circuit 14. The short circuit detecting circuit 3 in this embodiment includes first resistor R108, second resistor R92, and first capacitor C54. The first resistor R108 and the second resistor R92 are connected in series between the output ends of the second rectifying and filtering circuit 14, the first capacitor C54 is connected in parallel to both ends of the second resistor R92, and the output end of the short circuit detecting circuit 3 is connected to the signal input end of the signal processing circuit 4 at the connection point of the first resistor R108 and the second resistor R92.

The signal processing circuit 4 is configured to calculate and judge whether there is a short circuit, and it is able to timing control and detect the short-circuit recovery of LED load in case of short circuit. The signal processing circuit 4 includes power supply circuit 41 and control chip 42 electrically connected to the power supply circuit 41. The power supply circuit 41 can use an existing circuit to process the supply voltage to adapt the control chip 42 to operate. The input end of the power supply circuit 41 is electrically connected to the output end of the second rectifying and filtering circuit 14, and the output end of the power supply circuit 41 is electrically connected to the power supply end of the control chip 42, so as to realize the power supply to the control chip 42.

The driving circuit 5 includes signal isolation circuit 51 and driving control circuit 52. The input end of the isolation circuit 51 is electrically connected to the control signal output end of the control chip 42, and the output end of the isolation circuit 51 is electrically connected to the input end of the driving control circuit 52. The driving control circuit 52 is connected to both ends of the first rectifying and filtering circuit 13, and the output end of the driving control circuit 52 is electrically connected to the input end of the switching tube 2. The driving circuit 5 can drive the switching tube 2 to be turned on or off according to the control signal of the signal processing circuit 4 to perform PWM dimming on the LED load in normal circumstances, and can drive the switching tube 2 to be turned off for short circuit protection in the case of a short circuit, and can drive the switching tube 2 to be turned on temporarily to detect the recovery condition when the LED load is short-circuited.

The working process of the dimming circuit of LED lamp is: when the LED load is short-circuited, the voltage at point A decreases, because the interaction of the first primary coil 111, the second primary coil 112 and the secondary coil 113 in the flyback transformer 11, the voltage at point B will also decreases, that is, after obtaining a reduced voltage signal from point B, the signal can be transmitted as a short-circuit voltage signal to the control chip 42 of the signal processing circuit 4, the control chip 42 compares the short-circuit voltage with short-circuit voltage threshold value stored therein, and if it is lower than the short-circuit voltage threshold value, a low level is output to the driving circuits, and the driving circuit 5 drives the switching tube 2 to be turned off, thereby making the output end of the dimming circuit of LED lamp enter into an unloaded state from short-circuited for protection.

In addition, in the case where a short circuit occurs and the switching tube 2 is turned off, the control chip 42 can control the driving circuit 5 to operate once every other time, for example, the driving circuit 5 is driven to turn on the switching tube 2 every 6 seconds, and then the short circuit detecting circuit 3 transmits the current voltage signal to the signal processing circuit 4. If the signal processing circuit 4 judges that it is still in the short circuit state, then the driving circuit 5 is controlled to drive the switching tube 2 to be turned off to continue the protection. If the signal processing circuit 4 judges that the current short circuit condition has been eliminated, the signal processing circuit 4 controls the driving circuit 5 to operate to drive the switching tube 2 to normally perform the turning off and conducting operations to realize the dimming operation of the LED load. This enables self-healing drive of the LED load.

The dimming circuit of LED lamp can effectively protect the LED load in the case of short circuit, and the response time is short. Moreover, it is also possible to perform self-recovery control in the case where the LED load is eliminated from the short circuit, and the use experience is good.

The above disclosure has been described by way of example and in terms of exemplary embodiment, and it is to be understood that the disclosure is not limited thereto. Rather, any modifications, equivalent alternatives or improvement etc. within the spirit of the invention are encompassed within the scope of the invention as set forth in the appended claims.

What is claimed is:

1. A dimming circuit for an LED lamp, electrically connected to the LED load, comprising:
   a constant voltage source for supplying power to the LED load;
   a switching tube connected in series with the LED load at the output end of the constant voltage source, and a dimming level of the LED load is realized through on and off of the switching tube;
   a short circuit detecting circuit, wherein an input end of the short circuit detecting circuit is electrically connected to the constant voltage source for detecting an output voltage of the power supply circuit to obtain a short circuit voltage signal;
   a signal processing circuit, wherein an input end of the signal processing circuit is electrically connected to an output end of the short circuit detecting circuit, used for calculating whether or not a short circuit condition occurs, and is capable of timing control detecting a short circuit recovery of the LED load in an event of a short circuit;
   a driving circuit electrically connected to an output end of the signal processing circuit and the switching tube, used for driving the switching tube to be turned on or off according to a control signal of the signal processing circuit to perform PWM dimming on the LED load under normal conditions, and driving the switching tube to be turned off for short circuit protection in a case of a short circuit, and driving the switching tube is turned off to achieve short circuit protection, and driving the switching tube to be turned on temporarily to detect a recovery condition when it is necessary to detect an elimination condition of the short circuit of the LED load,
   and wherein
   the constant voltage source includes a flyback transformer, a power management chip, a first rectifying and filtering circuit, and a second rectifying and filtering circuit;
   the flyback transformer includes a first primary coil, a second primary coil, and secondary coil;
   one end of the first primary coil is electrically connected to an external power source, and other end of the first primary coil is electrically connected to a control end of the power management chip;
   both ends of the secondary coil are electrically connected to the input end of the first rectifying and filtering circuit, and the driving circuit is connected to the output end of the first rectifying and filtering circuit, and an signal input end of the driving circuit is electrically connected to the output end of the signal processing circuit, and an drive output end of the driving circuit is electrically connected to the switching tube;
   both ends of the second primary coil are electrically connected to the input end of the second rectifying and filtering circuit;
   two power supply ends of the power management chip are respectively electrically connected to the external power source and the output end of the second rectifying and filtering circuit; the input end of the short circuit detecting circuit is connected to the output end of the second rectifying and filtering circuit.

2. The dimming circuit for LED lamp as claimed in claim 1, wherein the short circuit detecting circuit includes a first resistor, a second resistor, and a first capacitor, and the first resistor and the second resistor are connected in series between the output ends of the second rectifying and filtering circuit, the first capacitor is connected in parallel to both ends of the second resistor, and the output end of the short circuit detecting circuit is connected to the signal input end of the signal processing circuit at the connection point of the first resistor and the second resistor.

3. The dimming circuit for LED lamp as claimed in claim 1, wherein the signal processing circuit includes a power supply circuit and a control chip electrically connected to the power supply circuit, an input end of the power supply circuit is electrically connected to the output end of the second rectifying and filtering circuit, and the output end of the power supply circuit is electrically connected to the power supply end of the control chip.

4. The dimming circuit for LED lamp as claimed in claim 3, wherein the driving circuit includes a signal isolation circuit and a driving control circuit the input end of the isolation circuit is electrically connected to the control signal output end of the control chip, and the output end of the isolation circuit is electrically connected to the input end of the driving control circuit, the driving control circuit is connected to both ends of the first rectifying and filtering circuit, and the output end of the driving control circuit is electrically connected to the input end of the switching tube.

* * * * *